(12) United States Patent
Yamamoto

(10) Patent No.: US 7,119,952 B2
(45) Date of Patent: Oct. 10, 2006

(54) OPTICAL INSTRUMENT, EXPOSURE APPARATUS, AND DEVICE MANUFACTURING METHOD

(75) Inventor: Sumitada Yamamoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 10/978,332

(22) Filed: Nov. 2, 2004

(65) Prior Publication Data
US 2005/0117226 A1    Jun. 2, 2005

(30) Foreign Application Priority Data
Nov. 4, 2003 (JP) .............................. 2003-374113

(51) Int. Cl.
*F21V 9/06* (2006.01)

(52) U.S. Cl. ...................... 359/358; 359/667; 359/513; 355/30

(58) Field of Classification Search ................ 359/228, 359/358, 395, 509, 513, 667, 704, 885, 886; 250/201.3, 573; 355/30
See application file for complete search history.

(56) References Cited

U.S. PATENT DOCUMENTS

2004/0156049 A1*  8/2004  Breninger et al. .......... 356/364

OTHER PUBLICATIONS

Okabe, Hideo. "Photochemistry of Small Molecules," A Wiley-Interscience Publication, 1978, pp. 178-179.

* cited by examiner

*Primary Examiner*—Hung X Dang
*Assistant Examiner*—Joseph Martinez
(74) *Attorney, Agent, or Firm*—Fitzpatrick, Cella, Harper & Scinto

(57) ABSTRACT

An exposure apparatus for exposing a substrate to ultraviolet light via a pattern of a reticle. The apparatus includes an optical element disposed on a path of the ultraviolet light extending from a light source to the substrate, a holder configured to hold the optical element, and a container configured to accommodate the optical element therein. The container has a partition wall with an opening through which the holder extends. The partition wall and the holder have a gap therebetween inside the opening. The holder is configured to move in a range of the opening so as to adjust a position of the optical element. The partition wall and the holder is configured so that a portion of the gap can be filled with a detachable filling cover. The apparatus further includes an outer cover detachably mounted on the container to cover the partition wall gas-tightly, and a supplier configured to supply inert gas into the container.

6 Claims, 7 Drawing Sheets

OPTICAL INSTRUMENT, EXPOSURE APPARATUS, AND DEVICE MANUFACTURING METHOD

FIELD OF THE INVENTION AND RELATED ART

This invention relates to an optical instrument containing an element to be used in an inactive (inert) gas ambience.

Production of semiconductor devices constituted by an extraordinarily fine pattern, such as LSIs or VLSIs, uses a reduction type projection exposure apparatus, which functions to print, by reduction projection, a circuit pattern formed on an original, such as a mask, onto a substrate being coated with a photosensitive material. Due to increases in semiconductor device packing density, requirements for reduction in pattern linewidth have become more severe. Thus, simultaneously with resist process developments, the resolving power of an exposure apparatus, as well, has been improved to meet this requirement.

The resolving power of an exposure apparatus can be improved either by changing the exposure wavelength to shorter ones or by enlarging the numerical aperture (NA) of the projection optical system.

As regards the exposure wavelength, a KrF excimer laser having an emission wavelength of about 248 nm was first used and, recently, an ArF excimer laser having an emission wavelength of about 193 nm has been developed. Now, a fluorine ($F_2$) excimer laser having an emission wavelength of about 157 nm is being developed.

With regard to an ArF excimer laser having a wavelength of the deep ultraviolet region, particularly, a wavelength of about 193 nm or a fluorine ($F_2$) excimer laser having an emission wavelength of about 157 nm, it is known that there are a plurality of oxygen ($O_2$) absorption bands in the bandwidth region in the rear of these wavelength regions.

For example, the wavelength of 157 nm of the fluorine excimer laser is in a wavelength region, which is generally called "vacuum ultraviolet". In this wavelength region, since absorption of light by oxygen molecules is large, the light hardly passes through the atmosphere. Unless the pressure is reduced to nearly about a vacuum, or the ambience is replaced by an inactive gas to sufficiently reduce the oxygen and moisture content, light cannot pass through. According to an article "Photochemistry of Small Molecules", by Hideo Okabe, A Wiley-Interscience Publication, 1978, page 178, the absorption coefficient of oxygen to light having a wavelength of 157 nm is about 190 $atm^{-1} cm^{-1}$. This means that, if light having a wavelength of 157 nm passes through a gas having an oxygen content of 1% and one atmospheric pressure, the transmissivity per 1 cm is very small, and can be represented by:

$$T=exp(-190 \times 1\ cm \times 0.01\ atm)=0.150.$$

Furthermore, due to absorption of light by oxygen, ozone ($O_3$) is produced. The ozone yet increases the absorption of light and, thus, the transmissivity decreases remarkably. Moreover, it is known as well that various substances produced by a photochemical reaction of laser light are adhered to surfaces of optical elements to decrease the light transmissivity of the optical system. If the light quantity decreases, the time necessary for exposure is prolonged and it causes a decrease in productivity.

Thus, in order to assure sufficient productivity, in the light path of an exposure optical system or of a position measuring optical that uses a light source based on a deep ultraviolet light, such as an ArF excimer laser or a fluorine ($F_2$) excimer laser, for example, purge means using an inactive gas, such as nitrogen, for example, is provided to keep the oxygen concentration and moisture content in the light path at a low level, not greater than a few ppm order.

As described, in an exposure apparatus having a light source using deep ultraviolet light, particularly, ArF excimer laser light or fluorine ($F_2$) excimer laser light, since absorption of exposure light by oxygen and moisture is large, optical components are sealingly accommodated in a gastight container and an inactive gas is continuously fed into the containter to reduce the oxygen and moisture content in the light path or to maintain the concentration of them and thereby to assure satisfactory transmissivity and stability.

As regards those optical components disposed in an inactive gas purge area being filled with an inactive gas, after assembling adjustment of the exposure apparatus and as long as they are operated in good order as a product, it would be unnecessary to demount them or to move them. Thus, they would not be accessed from outside of the purge container. So, there is no particular inconvenience even though the optical components are tightly enclosed in a closed container. However, during assembling adjusting of the exposure apparatus or for maintenance of it, there is a need for accessing the inside components from the outside of the container to perform position adjustment thereof. Hence, some position adjustment procedures require position adjustment of optical components while actually projecting exposure light and checking an image produced thereby.

However, as described above, the transmissivity of light having a wavelength of 157 nm is only 15% per 1 cm in an atmospheric pressure gas having an oxygen content of 1%. Currently, in a purge container sealingly accommodating optical components therein, the length of a light path through which the exposure light passes is at least hundreds of mm. Thus, even if the container is filled with a gas having an oxygen content of 0.1%, the transmissivity of light of 157 nm wavelength in that space would be nearly 0%. If the light path length of the purge container, which accommodates an optical component with respect to which the position adjustment is to be carried out, is 1 m, in order to keep the light transmissivity of that space by 1 m at 50% or more, the oxygen concentration throughout the whole light path must be kept at about 40 ppm or lower.

When an exposure apparatus is operated as a product machine, for higher productivity, the transmissivity of light should idealistically be near 100%. However, at the stage of assembling adjustment, the efficiency may be sacrificed and image observation may have a priority. If a transmissivity of 50% is a target, the oxygen concentration described above has to be satisfied. This is also with the case of moisture and carbon dioxide content.

While attaining such an oxygen content, yet an accessing space, adjusting means, securing means after adjustment have to be assured as well for attaining the position adjustment of an optical component. Generally, a sealing material for gas-tightly closing an inactive gas purge area uses, in many cases, an O-ring made of fluorine rubber, for example. However, if an O-ring is sandwiched between parts, a shift occurs when fastened by a screw. For minute position adjustment, such a shift tends to occur during a final fastening step to be carried out after the position is determined by an interim fastening step. Therefore, it is very difficult to keep the adjustment precision and, for this reason, it is not good to place an O-ring between parts of the adjusting mechanism.

In order to enable position adjustment of optical components while maintaining the gas-tightness of an inactive gas purge space, use of a sealing material for a movable component, such as a magnetic sealing material, for example, would be necessary. This makes the structure complicated and it raises the cost as well. Since the assembling adjustment needs to be done only a few times during the assembling, or at the time of installment, it is desirable to make it possible to accomplish the adjustment with a simple mechanism and without a large cost.

SUMMARY OF THE INVENTION

It is accordingly an object of the present invention to provide an optical instrument by which at least one of the inconveniences described above can be removed.

It is another object of the present invention to provide an optical instrument suitable for performing position adjustment of an element while maintaining the gas-tightness of a closed, inactive gas purge space.

In accordance with an aspect of the present invention, to achieve the above-described objects, there is provided an optical instrument, comprising an optical element, a position adjusting member provided in relation to the optical member, a casing for accommodating the optical element therein, the casing having a partition wall from which at least a portion of the position adjusting member is exposed, an outer cover for openably/closably covering the partition wall, and a supplying system for supplying an inactive gas into the casing.

In accordance with the present invention, an optical instrument, which is suitable for performing position adjustment of an element while maintaining the gas-tightness of a closed inactive gas purge space for that element, can be accomplished.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
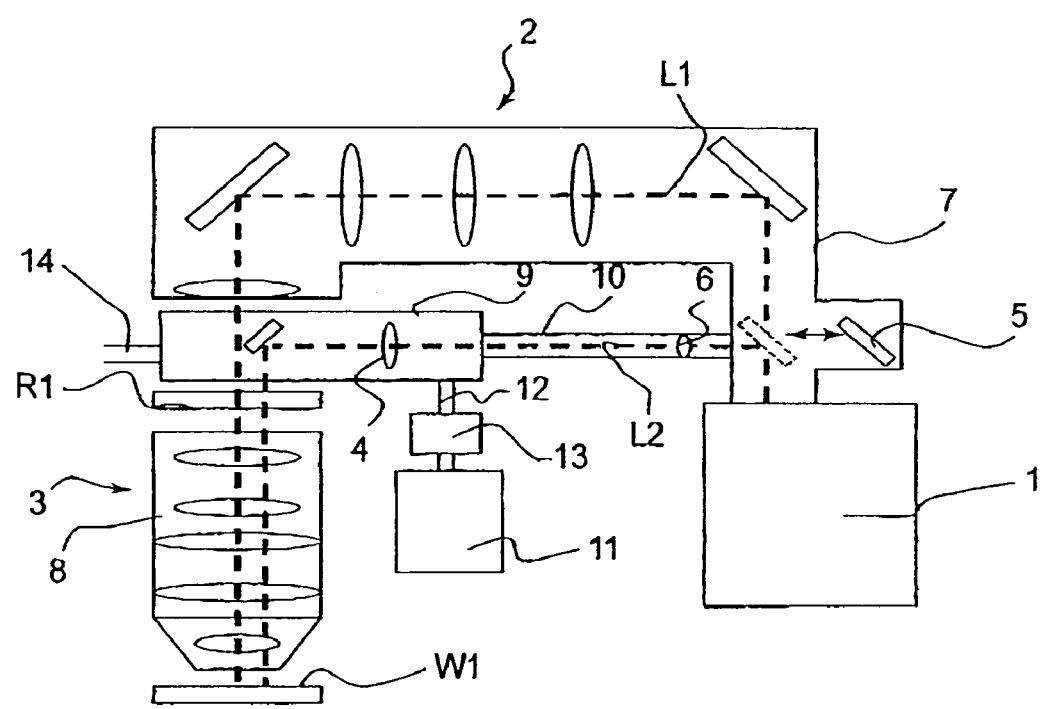
FIG. 1 is a schematic view of a main portion of a projection exposure apparatus to which the present invention can be applied.

Preferred embodiments of the present invention will now be described with reference to the attached drawings.

An exposure apparatus according to an embodiment of the present invention may be any type of an exposure apparatus known in the art, provided that ultraviolet light, or the like, is used as exposure light, that the path for exposure light inside the apparatus is filled with or replaced by an inactive gas, and that a pattern of an original, such as a mask, is projected and transferred to a photosensitive substrate through a projection optical system.

The ultraviolet light to be used as exposure light in an exposure apparatus of the present invention is not particularly limited. However, the invention is particularly effective when used with deep ultraviolet light, specifically, fluorine ($F_2$) excimer laser light having a wavelength of about 157 nm. In the following, referring to the drawings, preferred embodiments will be described in relation to examples wherein the original is a reticle and the photosensitive substrate is a wafer.

Embodiment 1

A first embodiment will now be described with reference to FIGS. 1–3. FIG. 1 illustrates an exposure apparatus in which the present invention can be embodied. Generally, an exposure apparatus according to the first embodiment comprises a light source 1 having an $F_2$ excimer laser, an illumination optical system 2, which is an optical system for rectifying laser light L1, emitted from the light source 1, into a light beam of a predetermined shape, and a projection optical system 3 for imaging the laser light L1, having been shaped by the illumination optical system 2 and passed through a reticle R1, upon a wafer W1, which is a substrate. Further, there is a TTL (Through-The-Lens) microscope 4, which is a measuring unit for measuring the positional relationship between the reticle R1 and the wafer W1. As regards the light source for the TTL microscope 4, a light path switching mirror mechanism 5 is provided inside the illumination optical system 2. When the TTL microscope is to be used, a mirror is inserted into the light path of the laser light L1, by which laser light L2 for the TTL microscope light source can be extracted. The laser light L2 goes through a laser light introducing optical system 6 and enters the TTL microscope 4.

The illumination optical system 2, the projection optical system 3, the TTL microscope 4 and the laser light introducing optical system 6 for this TTL microscope are all disposed inside purge container means (including containers 7–10), which defines an inactive gas purge space. To this purge gas container means 7–10, a nitrogen supplying device 11 for supplying nitrogen (inactive gas) is connected through a nitrogen gas supplying line 12 and a flow rate controller 13 provided on the gas supplying line 12 for variably controlling the flow rate therethrough. Further, a gas exhausting line 14 is connected to a gas exhaust port. With this arrangement, a nitrogen gas continuously flows inside the purge container means 7–10, such that oxygen concentration and moisture content are suppressed to be small, at a level sufficient enough for transmission of the $F_2$ laser light. In FIG. 1, only the nitrogen supplying path to the TTL microscope purge container 9 is illustrated. Actually, however, there are similar flowpassages for supplying a nitrogen gas to the remaining nitrogen gas purge containers 7, 8 and 10.

Figure 2:
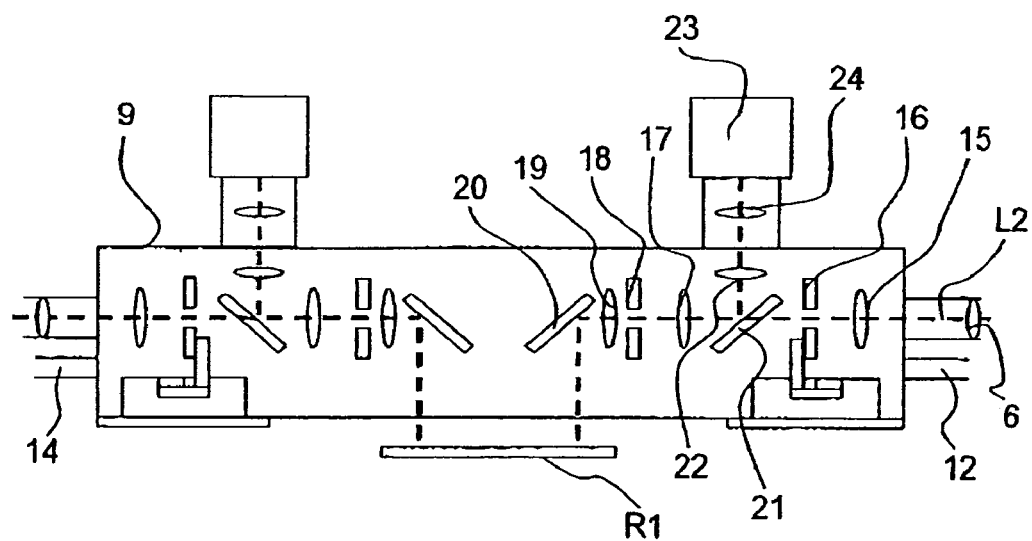
FIG. 2 is a schematic view of a first embodiment of the present invention.

FIG. 2 illustrates details of the inside structure of the TTL microscope of FIG. 1, as seen from the left-hand side in FIG. 1. The TTL microscope of this example is arranged so that laser light L2 is introduced into the microscope as illumination light, and marks formed on a wafer and a reticle are picked up as an image through a CCD camera, on the basis of which the positional relationship between these marks is measured. Details of the TTL microscope will be described below, in conjunction with FIG. 2.

The illumination light is introduced by the laser introducing optical system 6 into the TTL microscope. The incident laser light goes through an illumination optical system lens 15, a σ stop 16, a relay lens 17, an NA stop 18, and an object lens 19, and it is reflected by a mirror 20. The light is thus projected and imaged upon the mark on the reticle and the mark surface on the wafer. The returning light goes back along the same (reverse) path and, after passing through the relay lens 17, the light is reflected by a beam splitter 21. The light then goes through an erector lens 22, and it is imaged upon the detection surface of a CCD camera 23. The TTL microscope is provided with a pair of optical systems each having the above-described structure, such that any angular deviation of the reticle or wafer can be detected as well. The positions of optical components of the microscope are controlled on the basis of the precision of holding parts or adjustment with respect to reference laser light having a wavelength different from the exposure light wavelength.

Practically, however, after all the lenses are assembled, in some cases, it becomes necessary to precisely adjust the position of an optical component or components while observing a deviation amount, or the like, by actually irradiating the exposure light. For example, among the optical components included in FIG. 2, as regards the σ stop 16 of the illumination system and the NA stop 18 before the objective lens 19, they must be placed so as not to cause a relative deviation with respect to the optical axis when actual exposure light is projected. If they have a deviation, light is obliquely projected on the marks of the reticle and the wafer, which are just going to be observed. If this occurs, a focus error directly causes a shift of the image. Although the position adjustment is accomplished accurately, as much as possible, prior to introduction of exposure light, if exposure light is actually projected, the imaging plane or the optical axis may slightly shift from their design values due to minute eccentricity of tilt, which results from an error in shape or mounting error of the parts, such as illumination optical system lens 15, relay lens 17, object lens 19, and the like. Thus, it is necessary to take a step for finally registering the stop or stops with respect to the optical axis being slightly deviated by adjustment residual.

Hence, exposure light is introduced and the position adjustment is performed while checking the positions of the two stops. To this end, a pupil plane imaging lens 24 is disposed before the CCD camera 23, to enable that the two pupil positions can be observed by the CCD camera 23. Thus, while observing the pupil plane positions, it is necessary to align the σ stop 16 with respect to the NA stop 18. In order to make it possible to perform the observation through the CCD camera 23, while exposure light is projected, a sufficient transmissivity is required to allow the exposure light ($F_2$ laser light) to reach the detection surface of the CCD camera. In order to meet this, the oxygen concentration and moisture content along the light path of laser light L2 must be maintained at a predetermined level or lower.

Figure 3A:
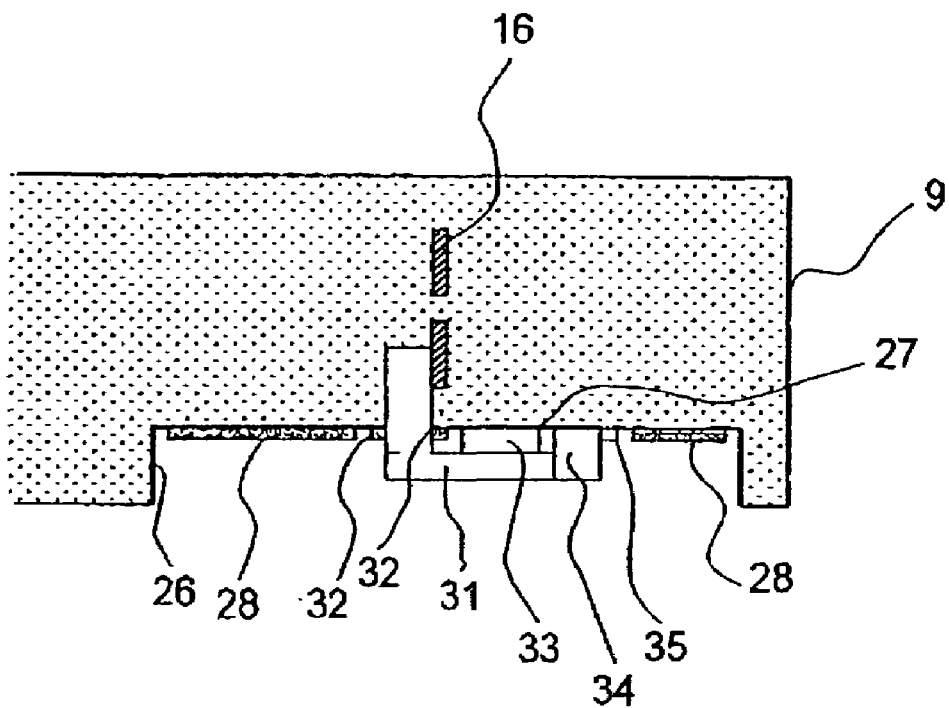
FIGS. 3A and 3B are schematic views, respectively, for explaining details of an adjusting mechanism in the first embodiment of the present invention.
Figure 3B:
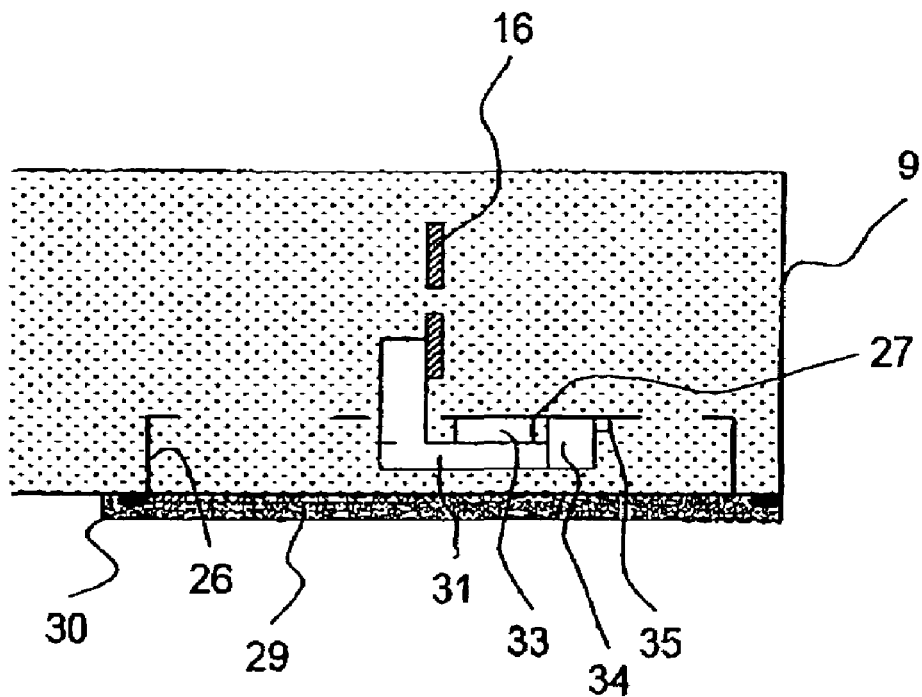

FIGS. 3A and 3B illustrate details of the mechanism for performing position adjustment of the σ stop 16 while the exposure light is being projected, and, particularly, they show a portion around the stop 16. FIG. 3A illustrates the state in which stop position adjustment is carried out during the assembling procedure, for example. FIG. 3B shows the state in normal operation of the apparatus. In FIGS. 3A and 3B, the σ stop is attached to a partition wall 27.

The partition wall 27 is connected to the inner end of a protruded wall 26, which projects inwardly from an outer wall, on which an outside cover 29 is attached. The partition wall 27 has a plurality of openings. Inside cover 28 constitutes a portion of the partition wall 27 and it is used for stop position adjustment, or the like. The inside cover 28 is attached to the partition wall by means of a screw in FIG. 3A, to close the openings of the partition wall. The inside cover is, therefore, detachably mounted. The outside cover 29 provides an outer wall, and it has a detachable mountable structure as well. Between the outside cover 29 and the purge container 9, there is an O-ring 30 as a sealing member sandwiched there, by which high gas-tightness can be maintained. In FIG. 3A, this outside cover 29 is removed. In a normal operation state of the apparatus, it is attached as shown in FIG. 3B. Referring now to FIGS. 1, 2 and 3, the procedure for position adjustment of the σ stop 16 will be explained below.

A pupil imaging lens 24 is inserted before the CCD camera 23 of FIG. 2, to assure the condition that the pupil plane can be imaged on the CCD camera 23 and the pupil position can be observed thereby. Subsequently, the σ stop portion inside the TTL microscope, which is the subject of position adjustment is brought into the state shown in FIG. 3A. In this state, there is a gap defined between the partition wall 27 and the holding member 31, which gap corresponds to the adjustment margin for allowing adjustment of the stop. The stop holding member 31 is provided with a gas filling cover 32 to minimize the gas as much as possible. In order to reduce the quantity of atmospheric gas flowing through the residual clearance, the flow rate of nitrogen to be supplied into the TTL microscope purge container may be temporarily increased through the flow rate controller 13 of FIG. 1. With the above-described arrangement, it is now possible to access the σ stop position adjusting mechanism while keeping the oxygen concentration and moisture content at a sufficiently low level to obtain a transmissivity required for the laser light L2 entering the TTL microscope 4 to reach the CCD camera 23. Through this CCD camera 23, of the pupil plane stop positions, the position of the NA stop 18 before the objective lens 19 is observed, and then, the position is precisely adjusted by adjusting the thickness of spacers 33 and 34 to ensure that the center of the NA stop 18 and the center of the sigma stop 16 are registered with each other and yet, the focus position is placed at the same position. Denoted at 35 is a pin for nominal positioning. After the fine adjustment, the σ stop holding member 31 is fixed to the partition wall 26 by screws. After completion of the adjustment, in the TTL microscope purge container 9, the inside cover 28 and the gap filling cover 32 are demounted, and the outside cover 29 is mounted. As a result, the σ stop position adjusting mechanism as a whole is accommodated in the TTL microscope purge area, and the space can be tightly closed against the outside atmosphere. In order to facilitate the exhaust of atmospheric gas collected at the adjustment area, an openable/closable nitrogen exhaust port (not shown) may be formed in the outside cover 29. This exhaust port may be kept open just after the casing is closed tightly, to enable efficient replacement of atmosphere, collected at the position adjusting mechanism area, by nitrogen.

With the procedure described above, the position adjustment for an optical stop is enabled while exposure light is actually being projected and an image produced thereby is being checked. On the other hand, in operation of the apparatus after the position adjustment, high gas-tightness of the nitrogen purge area can be maintained such that the oxygen concentration and moisture content can be kept low and the laser transmissivity can be kept high.

Embodiment 2

Figure 4A:
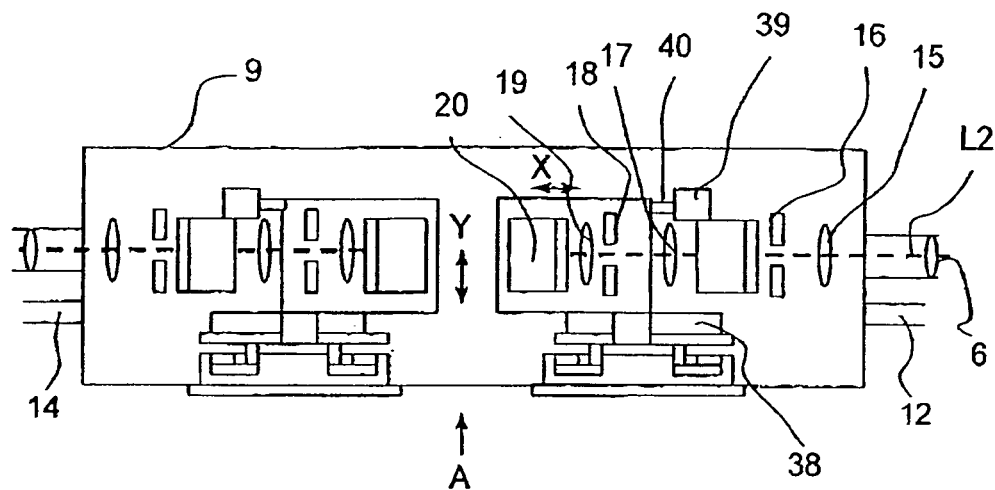
FIGS. 4A and 4B are schematic views, respectively, of a second embodiment of the present invention.
Figure 4B:
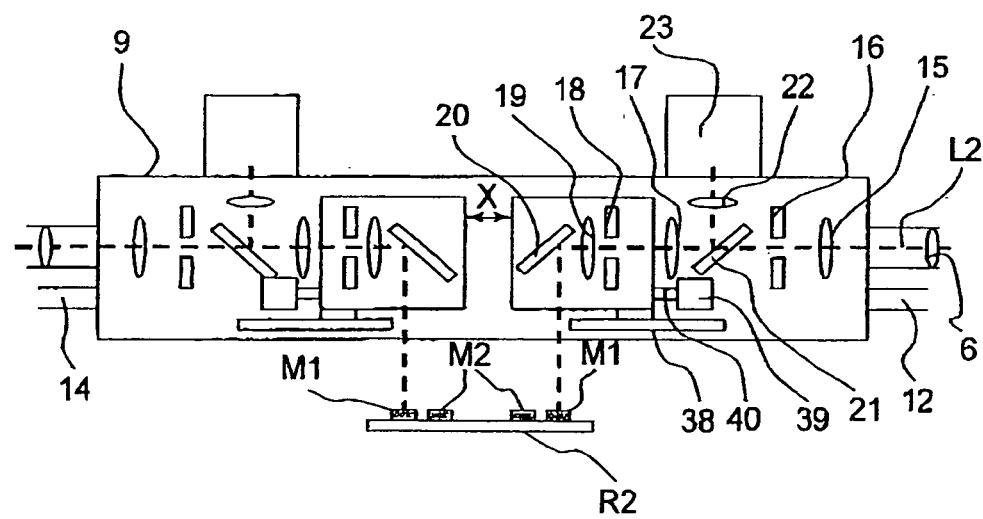

FIGS. 4A and 4B are schematic views, respectively, for explaining a second embodiment of the present invention. FIG. 4A illustrates another embodiment of the TTL microscope provided in a similar exposure apparatus as that of FIG. 1 and having a similar function as that of the preceding embodiment. In FIGS. 4A and 4B, the components corresponding to or having a similar function as those shown in FIG. 2 are denoted by like numerals, and a detailed description of them will be omitted. In this embodiment, the objective lens 19 has a function for moving in the X (horizontal) direction in the drawing, together with a mirror 20, to enable observation of reticle and wafer marks at different positions in the X direction. This differs from the TTL microscope of the first embodiment. The objective lens 19 and the mirror 20 are fixed onto a linear guide 38, and they can be moved in the X direction by means of a pulse motor 39 and a ball screw 40. Here, when the objective lens 19 and the mirror 20 are moved straight in the X direction, if there is a deviation between the motion of the linear guide 38 and the placement of marks M1 and M2 on the reticle, a measurement error occurs as if the marks M1 and M2 of the reticle are shifted in the Y (vertical) direction in the drawing. If the deviation is larger, in the worst case, it is possible that the mark cannot be caught by the observation field.

It is, therefore, necessary that the motion of the linear guide 38 is accurately registered with the disposition of the reticle marks M1 and M2 to avoid deviation in the Y direction as the objective lens 19 and the mirror 20 are moved in the X direction. To this end, when the TTL microscope is assembled, a reticle R2 having marks M1 and M2 formed at different positions with respect to the X direction may be provided. Then, laser light L2 is projected into the TTL microscope, and the mirror 20 and the objective lens 19 are moved, and then, the marks M1 and M2, provided on the reticle R2 at different positions with respect to the X direction, are observed. The mounting angle of the driving means should be adjusted so that these marks can be observed without a deviation in the Y direction.

Figure 5A:
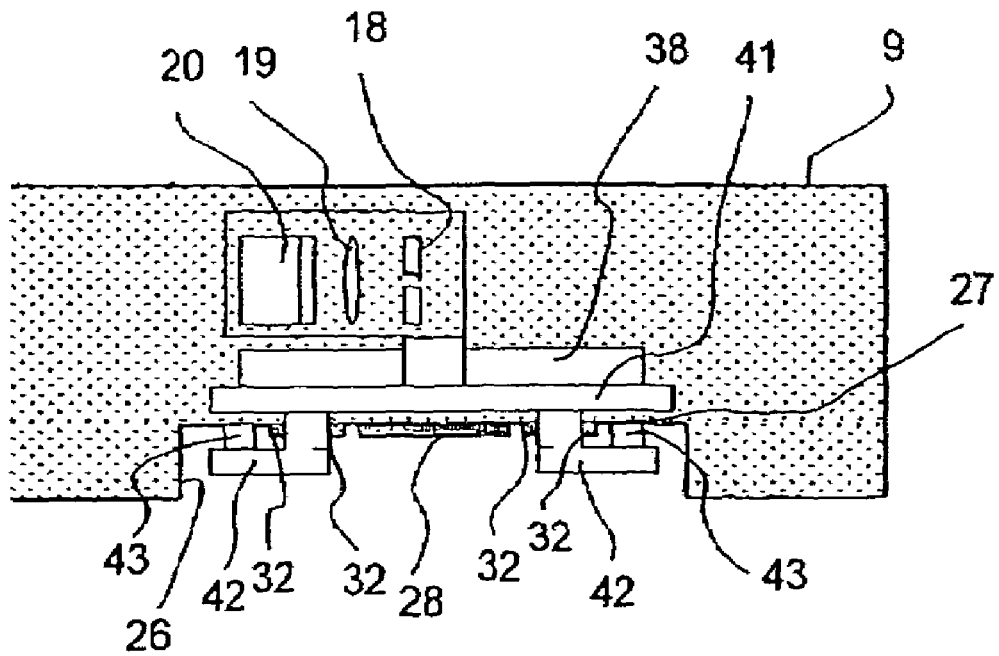
FIGS. 5A and 5B are schematic views, respectively, for explaining details of an adjusting mechanism in the second embodiment of the present invention.
Figure 5B:
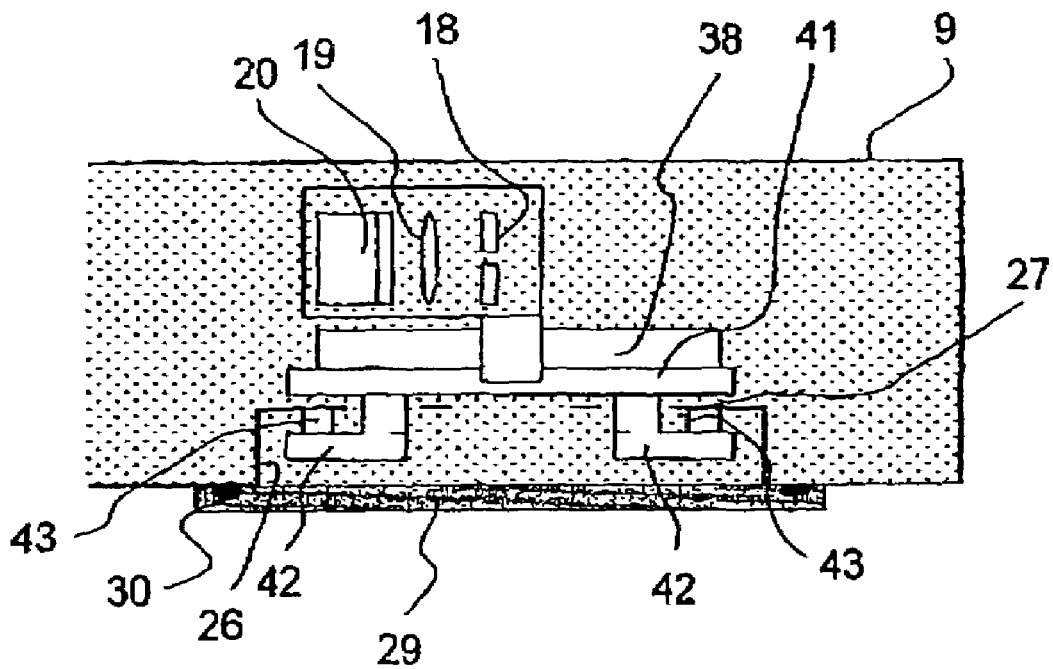

In order to allow that exposure light passes the TTL microscope and the marks are observed, as in the first embodiment, the oxygen concentration and moisture content must be kept low. FIGS. 5A and 5B illustrate details of driving means in FIGS. 4A and 4B, for explanation of the mechanism for performing position adjustment of the driving means for the mirror 20 and objective lens 19. Specifically, FIG. 5A illustrates the state in which a linear guide motion adjustment is carried out during the assembling adjustment procedure, for example. FIG. 5 shows the state in a normal operation of the apparatus. In FIGS. 5A and 5B, the driving means on which the mirror 20 and the objective lens 19 are mounted is attached to the linear guide 38, and they are attached to the partition wall 27 as in the first embodiment, through a base 41 and a driving means fixing member 42. Since the remaining components, such as outside cover 29, inside cover 28, gas filling cover 32 and O-ring 30 are similar to those in the first embodiment, a description thereof will be omitted.

The adjustment procedure will now be described. First, a reticle R2 having marks M1 and M2 at different positions, as shown in FIG. 4, is placed. Subsequently, the outside cover 29 of the driving unit on which the mirror 20 and the objective lens 19 are mounted, to be position adjusted, is demounted. Then, the covers 28 and 39 are mounted, and the state shown in FIG. 5A is reached. In order to reduce the inflow of atmosphere through a residual clearance, the flow rate of nitrogen to be supplied into the microscope may be temporarily increased, as in the first embodiment. With the procedure described above, it is assured to access the position adjusting portion while the oxygen concentration and moisture content are maintained to be low to attain sufficient transmissivity required for the introduced exposure light to reach the CCD camera. In this state, laser light L2 is projected into the microscope and the outer mark M1 on the reticle 23 is observed through the CCD camera. Subsequently, the mirror 20 and the objective lens 19 are moved by the driving mechanism to positions for observation of the inner mark M2. Here, the thickness of the spacer 43 is adjusted and the mounting angle of the linear guide fixing member 41 is adjusted to ensure that the observed deviation amount in the Y direction of the inner mark M2 with respect to the outer mark M1 becomes less than the resolving power of the CCD camera 23. After this precise adjustment, the driving unit fixing member 42 is fixed to the partition wall 27 by screws.

After the adjustment is completed, the covers 28 and 32 are demounted, and the outside cover 29 is mounted. By this, the driving means as a whole can be accommodated in the TTL microscope purge area and the space can be closed with high gas-tightness against the outside atmosphere.

With the procedure described above, fine adjustment of the mounting angle of the mirror and the objective lens driving unit is enabled, while exposure light is projected and the mark position on the reticle is being observed. On the other hand, in operation of the apparatus after the adjustment, high gas-tightness can be maintained.

Embodiment of a Device Manufacturing Method

Next, an embodiment of a device manufacturing method, which uses an exposure apparatus described above, will be explained.

Figure 6:
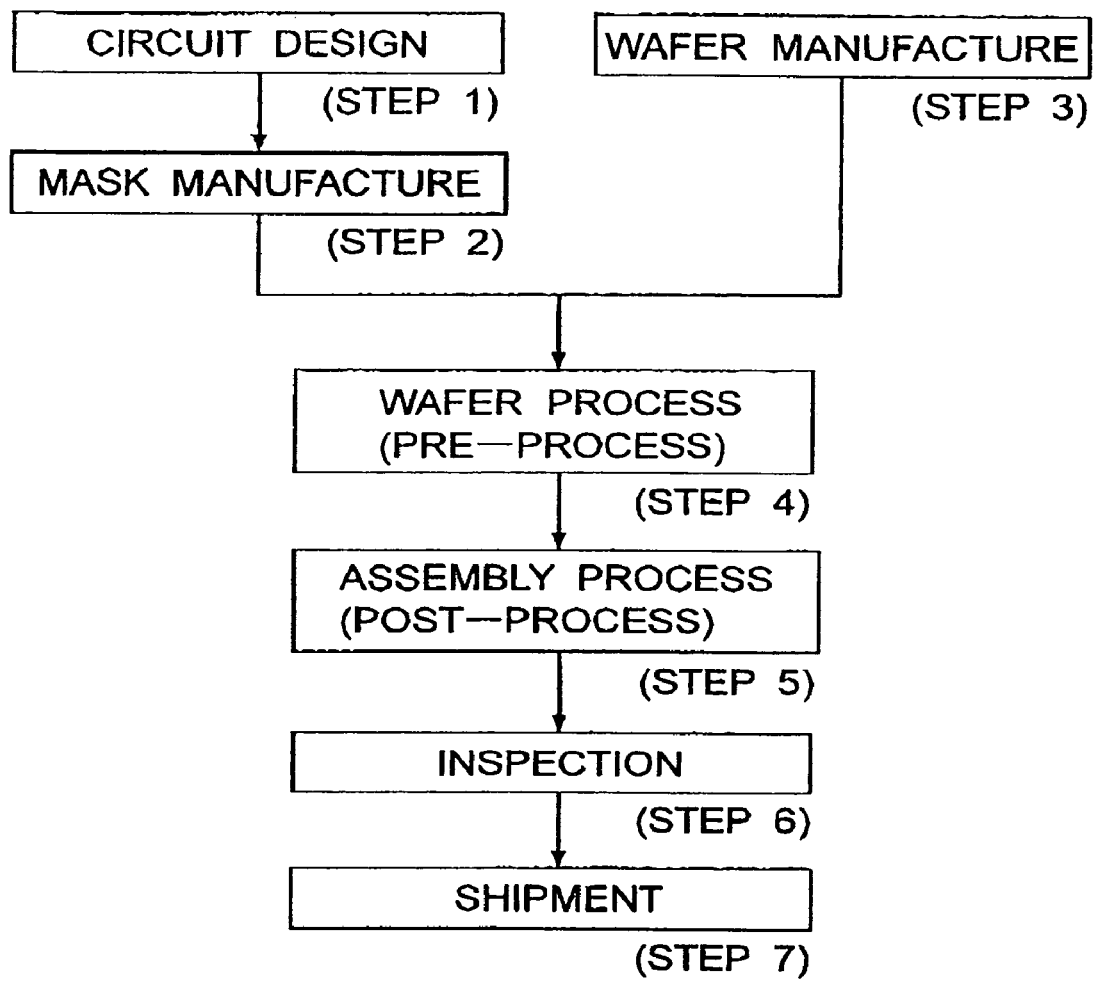
FIG. 6 is a flow chart for explaining a sequential procedure of microdevice production.

FIG. 6 is a flow chart for explaining the procedure of manufacturing various microdevices, such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 7:
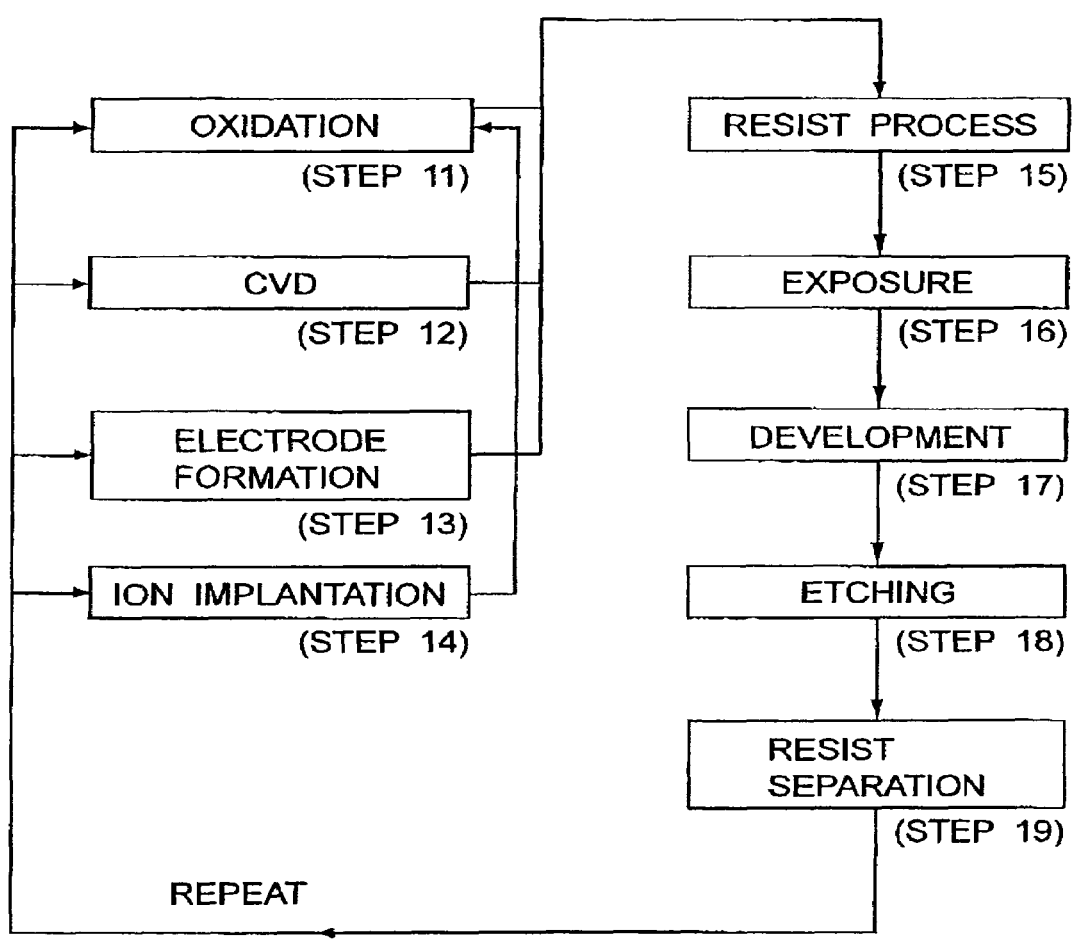
FIG. 7 is a flow chart for explaining details of a wafer process included in the procedure of FIG. 6.

FIG. 7 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with decreased cost.

In accordance with the embodiments of the present invention described above, in an optical instrument or a projection exposure apparatus using ultraviolet light, such as a fluorine excimer laser as a light source, position adjustment for an optical component inside the instrument or apparatus mainly for its assembling adjustment can be carried out with a decreased cost and a with a simple structure, while exposure light is actually projected into the instrument or apparatus. As a result, alignment of optical components of a measuring system or an exposure system can be accomplished accurately with low cost and, additionally, after the adjustment, the oxygen concentration and moisture content along the path of exposure light can be kept to be sufficiently low. This enables high precision alignment and improved image performance and, yet, loss of light quantity of the laser light is reduced. Therefore, projection of a fine pattern can be done efficiently and stably.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-374113 filed Nov. 4, 2003, which is hereby incorporated by reference.

What is claimed is:

1. An exposure apparatus for exposing a substrate to ultraviolet light via a pattern of a reticle, said apparatus comprising:

an optical element disposed on a path of the ultraviolet light extending from a light source to the substrate;

a holder configured to hold said optical element;

a container configured to accommodate said optical element therein, said container having a partition wall with an opening through which said holder extends, said partition wall and said holder having a gap therebetween inside the opening, said holder being configured to move in a range of the opening so as to adjust a position of said optical element, said partition wall and said holder being configured so that a portion of the gap can be filled with a detachable filling cover;

an outer cover detachably mounted on said container to cover said partition wall gas-tightly; and a supplier configured to supply inert gas into said container.

2. An apparatus according to claim 1, wherein said partition wall is configured to support said optical element through said holder.

3. An apparatus according to claim 1, wherein said partition wall has another opening, and said partition wall being configured so that the other opening is closed by an inner cover, the inner cover being detachably mounted on said partition wall.

4. An apparatus according to claim 1, further comprising an O-ring provided between said outer cover and said container.

5. An apparatus according to claim 1, further comprising (i) an illumination optical system configured to illuminate the pattern, (ii) a projection optical system configured to project the pattern onto the substrate, and (iii) a measurement optical system configured to measure a positional relationship between the reticle and the substrate, said optical element being included in one of said illumination optical system, said projection optical system and said measurement optical system.

6. A method of manufacturing a device, said method comprising steps of:

exposing a substrate to ultraviolet light via a pattern of a reticle by use of an exposure apparatus as defined in claim 1;

developing the exposed substrate; and processing the developed substrate to manufacture the device.

* * * * *